United States Patent
Lee

(10) Patent No.: US 7,630,244 B2
(45) Date of Patent: Dec. 8, 2009

(54) METHODS OF OPERATING MEMORY DEVICES INCLUDING DISCHARGE OF SOURCE/DRAIN REGIONS AND RELATED ELECTRONIC DEVICES

(75) Inventor: Seungwon Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 111 days.

(21) Appl. No.: 12/028,303

(22) Filed: Feb. 8, 2008

(65) Prior Publication Data

US 2008/0239830 A1 Oct. 2, 2008

(30) Foreign Application Priority Data

Mar. 30, 2007 (KR) .......................... 2007-0031524

(51) Int. Cl.
*G11C 11/04* (2006.01)
(52) U.S. Cl. ............................ 365/185.17; 365/185.25; 365/185.26; 365/185.29
(58) Field of Classification Search ............ 365/185.17, 365/185.25, 185.26, 185.29
See application file for complete search history.

(56) References Cited

U.S. PATENT DOCUMENTS

| 5,748,531 | A | 5/1998 | Choi |
| 6,646,925 | B2 | 11/2003 | Kaya et al. |
| 7,233,526 | B2* | 6/2007 | Umezawa ............... 365/185.27 |
| 7,369,442 | B2* | 5/2008 | Lee et al. ............... 365/185.25 |
| 2006/0250854 | A1 | 11/2006 | Lee et al. |

FOREIGN PATENT DOCUMENTS

| JP | 2000-021186 A | 1/2000 |
| KR | 10-2006-0057959 A | 5/2006 |
| KR | 1020060115129 A | 11/2006 |

* cited by examiner

*Primary Examiner*—Pho M. Luu
(74) *Attorney, Agent, or Firm*—Myers Bigel Sibley & Sajovec, P.A.

(57) ABSTRACT

A memory device may include a memory cell array having a plurality of memory cell transistors serially coupled in a string between a string selection transistor and a ground selection transistor. The string selection transistor may be coupled between the string and a bit line, and the ground selection transistor may be coupled between the string and a common source line. In addition, each memory cell transistor may includes a floating gate between a control gate electrode and a semiconductor substrate, and source/drain regions of the semiconductor substrate may be included on opposite sides of the control gate electrode. Responsive to an erase command, the memory cell transistors of the string may be erased. Further responsive to the erase command and after erasing the memory cell transistors of the string, electrical charge from the source/drain regions of the memory cell transistors may be discharged through the ground selection transistor to the common source line and/or through the string selection transistor to the bit line. Related devices are also discussed.

25 Claims, 11 Drawing Sheets

Fig. 2

(Related Art)

|  | Erase | Program | Read |
|---|---|---|---|
| Sel. W/L | -7V | 10V | 0 |
| Unsel W/L | Float | 4V | Vread |
| SSL | Float | Vcc | Vread |
| GSL | Float | 0 | Vread |
| CSL | Float | 0 | 0 |
| "0" B/L | Float | 0 (Program) | 1.2 |
| "1" B/L | Float | Vcc (inhibit) | <0.8 |
| Bulk | 10V | -4V | 0 |

METHODS OF OPERATING MEMORY DEVICES INCLUDING DISCHARGE OF SOURCE/DRAIN REGIONS AND RELATED ELECTRONIC DEVICES

RELATED APPLICATIONS

This U.S. non-provisional patent application claims priority under 35 U.S.C. § 119 of Korean Patent Application No. 10-2007-0031524, filed on Mar. 30, 2007, the disclosure of which is hereby incorporated herein by reference in its entirety.

FIELD OF THE INVENTION

The present invention generally relates to electronic memory devices, and more particularly, to nonvolatile memory devices and related methods.

BACKGROUND

FIG. 1A is a block diagram of a conventional nonvolatile flash memory device 100, and FIG. 1B is a cross-sectional view of a string of memory cell transistors MC1 to Mci−1 from the nonvolatile flash memory device 100 of FIG. 1A. In particular, the nonvolatile memory device 100 may include a memory cell array 110, a row decoder (X-Dec) 120, a sense amplifier and write driver (SA & WD) 130, and a bulk bias driver 140. The memory cell array 110 may include a plurality of blocks (including BLK0, . . . BLKm−2, and BLKm−1, where m is the number of blocks). As shown with respect to block BLK0, each block may include a plurality of strings of nonvolatile memory cell transistors.

As shown in FIGS. 1A and 1B, a string of memory cells may include a plurality of memory cells MC0 to MCi−1 (where i is the number of memory cell transistors in a string) serially coupled between a string selection transistor SST and a ground selection transistor GST. More particularly, the string selection transistor SST may be electrically coupled between the string of memory cell transistors and a bit line BL0, and the ground selection transistor GST may be electrically coupled between the string of memory cell transistors and a common source line CSL. Moreover, each nonvolatile memory cell transistor may include a floating gate FG between a control gate electrode (provided by a word line WL) and semiconductor substrate 115. While not explicitly shown in FIGS. 1A and 1B, each nonvolatile memory cell transistor may include a tunnel insulating layer between the floating gate FG and the substrate 115, and a dielectric layer between the floating gate FG and the control gate electrode (or word line WL). Moreover, n-type source/drain regions S/D may be provided on opposite sides of the floating gate FG of each memory cell transistor, and on opposite sides of the control gate electrodes of the ground and string selection transistors GST and SST.

As shown in block BLK0 of FIG. 1A, each word line WL in a block may be electrically coupled between the row decoder 120 and control gate electrodes of memory cell transistors MC of different strings in a same row. Similarly, a string selection line SSL may be electrically coupled between the row decoder 120 and control gate electrodes of string selection transistors SST of different strings in the same block, and a ground selection line GSL may be electrically coupled between the row decoder 120 and control gate electrodes of ground selection transistors GST of different strings in the same block.

Moreover, each bit line BL0 to BLn−1 may be electrically coupled between the sense amplifier and write driver 130 and a respective string of memory cell transistors in the same block. In addition, each bit line may be electrically coupled to different strings of memory cell transistors in a same column but in different blocks. Furthermore, each block BLK of memory cells transistors may be provided in a same p-well driven to different electrical potentials by bulk bias driver 140.

FIG. 2 is a table listing voltage conditions provided during Erase, Program, and Read operations for the nonvolatile memory device of FIGS. 1A and 1B. During a block erase operation, for example, a negative 7 volt signal may be applied to the word lines WL0 to WLi−1 coupled to the selected block BLK0 being erased; word lines coupled to unselected blocks may be allowed to float; and a voltage $V_{BULK}$ of the bulk p-well may be driven to 10 volts. Moreover, the string and ground selection lines SSL and GSL, the common source lines CSL, and the bit lines BL may be allowed to float. A block erase operation may thus be used to selectively erase all memory cell transistors of a selected block without erasing memory cell transistors of other blocks.

A cross sectional view of a memory cell transistor subjected to the erase conditions of FIG. 2 is shown in FIG. 3. In FIG. 3, the voltage $V_{WL}$ of the word line WL (providing the control gate electrode of the memory cell transistor) is driven to negative 7 volts (V1), and the voltage $V_{BULK}$ of the p-well bulk is driven to positive 10 volts (V2), so that a 17 volt potential difference (V2−V1) is provided between the word line WL and p-well bulk. Accordingly, negative charge may be driven from the floating gate FG (through the tunnel insulating layer) to the p-well bulk as indicated by arrows in FIG. 3 thereby erasing the memory cell. At the same time, positive charge may build up in the source/drain regions S/D on opposite sides of the floating gate FG as shown.

After programming the memory cell, a p-well bulk discharge may be used to reduce excess charge of the p-well bulk and the word line WL as shown in FIG. 4. More particularly, a voltage $V_{WL}$ of the word line WL and a voltage $V_{BULK}$ of the p-well bulk may both be driven to 0 volts. While some of the positive charge of the source/drain regions S/D may discharge into the p-well bulk as shown in FIG. 4, the n-type source/drain regions S/D may remain positively charged.

SUMMARY

According to embodiments of the present invention, a memory device may include a memory cell array having a plurality of memory cell transistors serially coupled in a string between a string selection transistor and a ground selection transistor. The string selection transistor may be coupled between the string and a bit line, and the ground selection transistor may be coupled between the string and a common source line. Moreover, each memory cell transistor may include a floating gate between a control gate electrode and a semiconductor substrate, and source/drain regions of the semiconductor substrate may be included on opposite sides of the control gate electrode. Responsive to an erase command, the memory cell transistors of the string may be erased. Further responsive to the erase command and after erasing the memory cell transistors of the string, electrical charge from the source/drain regions of the memory cell transistors may be discharged through the ground selection transistor to the common source line and/or through the string selection transistor to the bit line.

Discharging electrical charge may be performed before any other operation for the memory cell transistors of the string after erasing the memory cell transistors of the string. More particularly, discharging electrical charge may be performed before any program and/or read operation for the memory cell transistors of the string after erasing the memory cell transistors of the string. After discharging electrical charge from the source/drain regions of the memory cell transistors, an erase verify operation may be performed for the memory cell transistors of the string. Moreover, discharging electrical charge from the source/drain regions may include discharging positive electrical charges from the source/drain regions.

Discharging electrical charge from the source/drain regions may include applying an enable signal to the control gates of all of the memory cell transistors of the string. Discharging electrical charge from the source/drain regions may further include applying a discharge signal to the ground selection transistor and/or to the string selection transistor wherein the discharge signal has a magnitude less than a magnitude of the enable signal during at least a portion of the discharging operation. In addition or in an alternative, discharging electrical charge from the source/drain regions may include applying a discharge signal to the ground selection transistor and/or to the string selection transistor wherein the discharge signal has a magnitude that increases during at least a portion of the discharging operation.

Discharging electrical charge from the source/drain regions of the memory cell transistors may include discharging electrical charge from the source/drain regions through the ground selection transistor to the common source line and through a common source line transistor to a reference ground. More particularly, discharging electrical charge from the source/drain regions may include applying an enable signal to the control gates of all of the memory cell transistors. In addition, discharging electrical charge from the source/drain regions may include applying a discharge signal to a control gate of the common source line transistor wherein the discharge signal has a magnitude less than a magnitude of the enable signal during at least a portion of the discharging operation, and/or wherein the discharge signal has a magnitude that increases during at least a portion of the discharging operation.

The memory cell array may include a second plurality of memory cell transistors serially coupled in a second string between a second string selection transistor and a second ground selection transistor. The second string selection transistor may be coupled between the second string and a second bit line, and the second ground selection transistor may be coupled between the string and the common source line. The memory cell transistors of the first and second strings may be in a same well region, and erasing the memory cell transistors of the string may include erasing the memory cell transistors of the first and second strings responsive to receiving the erase command. Moreover, discharging electrical charge may include discharging electrical charge from the source/drain regions of the memory cell transistors of the first string through the first ground selection transistor to the common source line and/or through the first string selection transistor to the first bit line. Electrical charge from the source/drain regions of the memory cell transistors of the second string may be discharged through the second ground selection transistor to the common source line and/or through the second string selection transistor to the second bit line.

The memory cell array may include a second plurality of memory cell transistors serially coupled in a second string between a second string selection transistor and a second ground selection transistor. The second string selection transistor may be coupled between the second string and the bit line, and the second ground selection transistor may be coupled between the string and a second common source line. Moreover, the memory cell transistors of the first and second strings may be in a same well region, and erasing the memory cell transistors of the string may include erasing the memory cell transistors of the first and second strings responsive to receiving the erase command. Discharging electrical charge may include discharging electrical charge from the source/drain regions of the memory cell transistors of the first string through the first ground selection transistor to the first common source line and/or through the first string selection transistor to the bit line. Electrical charge from the source/drain regions of the memory cell transistors of the second string may be discharged through the second ground selection transistor to the second common source line and/or through the second string selection transistor to the bit line.

According to other embodiments of the present invention, an electronic device may include a memory cell array and a controller electrically coupled to the memory cell array. The memory cell array may include a plurality of memory cell transistors serially coupled in a string between a string selection transistor and a ground selection transistor. The string selection transistor may be coupled between the string and a bit line, and the ground selection transistor may be coupled between the string and a common source line. In addition, each memory cell transistor may include a floating gate between a control gate electrode and a semiconductor substrate and source/drain regions of the semiconductor substrate on opposite sides of the control gate electrode. The controller may be configured to erase the memory cell transistors of the string responsive to an erase command. After erasing the memory cell transistors of the string, the controller may be configured to discharge electrical charge from the source/drain regions of the memory cell transistors through the ground selection transistor to the common source line and/or through the string selection transistor to the bit line responsive to the erase command.

The controller may be configured to discharge electrical charge before any other operation for the memory cell transistors of the string after erasing the memory cell transistors of the string. More particularly, the controller may be configured to discharge electrical charge before any program and/or read operation for the memory cell transistors of the string after erasing the memory cell transistors of the string. The controller may be configured to perform an erase verify operation for the memory cell transistors of the string after discharging electrical charge from the source/drain regions of the memory cell transistors. Discharging electrical charge from the source/drain regions may include discharging positive electrical charges from the source/drain regions.

The controller may be configured to discharge electrical charge from the source/drain regions by applying an enable signal to the control gates of all of the memory cell transistors of the string. The controller may be configured to discharge electrical charge from the source/drain regions by applying a discharge signal to the ground selection transistor and/or to the string selection transistor with the discharge signal having a magnitude less than a magnitude of the enable signal during at least a portion of the discharging operation, and/or with the discharge signal having a magnitude that increases during at least a portion of the discharging operation.

The controller may be configured to discharge electrical charge from the source/drain regions of the memory cell transistors by discharging electrical charge from the source/drain regions through the ground selection transistor to the common source line and through a common source line transistor to a reference ground. More particularly, the controller may be configured to discharge electrical charge from the source/drain regions by applying an enable signal to the control gates of all of the memory cell transistors. For example, the controller may be configured to discharge electrical charge from the source/drain regions by applying a discharge signal to a control gate of the common source line transistor with the discharge signal having a magnitude less than a magnitude of the enable signal during at least a portion of the discharging operation, and/or with the discharge signal having a magnitude that increases during at least a portion of the discharging operation.

The memory cell array may include a second plurality of memory cell transistors serially coupled in a second string between a second string selection transistor and a second ground selection transistor. The second string selection transistor may be coupled between the second string and a second bit line, and the second ground selection transistor may be coupled between the string and the common source line. In addition, the memory cell transistors of the first and second strings may be in a same well region, and the controller may be configured to erase the memory cell transistors of the string by erasing the memory cell transistors of the first and second strings responsive to receiving the erase command. The controller may be further configured to discharge electrical charge by discharging electrical charge from the source/drain regions of the memory cell transistors of the first string through the first ground selection transistor to the common source line and/or through the first string selection transistor to the first bit line. The controller may be further configured to discharge electrical charge from the source/drain regions of the memory cell transistors of the second string through the second ground selection transistor to the common source line and/or through the second string selection transistor to the second bit line.

The memory cell array may include a second plurality of memory cell transistors serially coupled in a second string between a second string selection transistor and a second ground selection transistor. The second string selection transistor may be coupled between the second string and the bit line, and the second ground selection transistor may be coupled between the string and a second common source line. Moreover, the memory cell transistors of the first and second strings may be in a same well region, and the controller may be configured to erase the memory cell transistors of the string by erasing the memory cell transistors of the first and second strings responsive to receiving the erase command. The controller may be configured to discharge electrical charge by discharging electrical charge from the source/drain regions of the memory cell transistors of the first string through the first ground selection transistor to the first common source line and/or through the first string selection transistor to the bit line. The controller may be further configured to discharge electrical charge from the source/drain regions of the memory cell transistors of the second string through the second ground selection transistor to the second common source line and/or through the second string selection transistor to the bit line.

According to still other embodiments of the present invention, an electronic device may include a memory cell array, and a controller electrically coupled to the memory cell array. The memory cell array may include a plurality of memory cell transistors serially coupled in a string between a string selection transistor and a ground selection transistor. The string selection transistor may be coupled between the string and a bit line, and the ground selection transistor may be coupled between the string and a common source line. Moreover, each memory cell transistor may include a floating gate between a control gate electrode and a semiconductor substrate and source/drain regions of the semiconductor substrate on opposite sides of the control gate electrode. The controller may be configured to erase the memory cell transistors of the string responsive to an erase command, and to discharge electrical charge from the source/drain regions of the memory cell transistors through the ground selection transistor to the common source line responsive to the erase command after erasing the memory cell transistors of the string. More particularly, the controller may include a word line driver, and a common source line driver. The word line driver may be configured to apply an enable signal to the control gates of all of the memory cell transistors of the string while discharging electrical charge from the source/drain regions of the memory cell transistors. The common source line driver may be configured to apply a discharge signal to a control gate of the ground selection transistor while discharging electrical charge from the source/drain regions of the memory cell transistors with the discharge signal being different than the enable signal.

The discharge signal may have a magnitude less than a magnitude of the enable signal while applying the enable signal to the control gates of all of the memory cell transistors of the string. In addition or in an alternative, the discharge signal may have a magnitude that increases while applying the enable signal to the control gates of all of the memory cell transistors of the string.

According to yet other embodiments of the present invention, an electronic device may include a memory cell array and a controller electrically coupled to the memory cell array. The memory cell array may include a plurality of memory cell transistors serially coupled in a string between a string selection transistor and a ground selection transistor. The string selection transistor may be coupled between the string and a bit line, and the ground selection transistor may be coupled between the string and a common source line. Moreover, each memory cell transistor may include a floating gate between a control gate electrode and a semiconductor substrate and source/drain regions of the semiconductor substrate on opposite sides of the control gate electrode. The controller may be configured to erase the memory cell transistors of the string responsive to an erase command, and to discharge electrical charge from the source/drain regions of the memory cell transistors through the string selection transistor to the bit line responsive to the erase command after erasing the memory cell transistors of the string. More particularly, the controller may include a word line driver and a string selection line driver. The word line driver may be configured to apply an enable signal to the control gates of all of the memory cell transistors of the string while discharging electrical charge from the source/drain regions of the memory cell transistors. The string selection line driver may be configured to apply a discharge signal to a control gate of the string selection transistor while discharging electrical charge from the source/drain regions of the memory cell transistors with the discharge signal being different than the enable signal.

The discharge signal may have a magnitude less than a magnitude of the enable signal while applying the enable signal to the control gates of all of the memory cell transistors of the string. In addition or in an alternative, the discharge signal may have a magnitude that increases while applying the enable signal to the control gates of all of the memory cell transistors of the string.

According to more embodiments of the present invention, an electronic device may include a memory cell array and a controller electrically coupled to the memory cell array. The memory cell array may include a plurality of memory cell transistors serially coupled in a string between a string selection transistor and a ground selection transistor. The string selection transistor may be coupled between the string and a bit line, and the ground selection transistor may be coupled between the string and a common source line. Moreover, each memory cell transistor may include a floating gate between a control gate electrode and a semiconductor substrate and source/drain regions of the semiconductor substrate on opposite sides of the control gate electrode. The controller may be configured to erase the memory cell transistors of the string responsive to an erase command. After erasing the memory cell transistors of the string, the controller may be configured to discharge electrical charge from the source/drain regions of the memory cell transistors through the ground selection transistor to the common source line responsive to the erase command. More particularly, the controller may include a word line driver and a ground selection line driver. The word line driver may be configured to apply an enable signal to the control gates of all of the memory cell transistors of the string while discharging electrical charge from the source/drain regions of the memory cell transistors. The ground selection line driver may be configured to apply a discharge signal to a control gate of the ground selection transistor while discharging electrical charge from the source/drain regions of the memory cell transistors with the discharge signal being different than the enable signal.

The discharge signal may have a magnitude less than a magnitude of the enable signal while applying the enable signal to the control gates of all of the memory cell transistors of the string. In addition or in an alternative, the discharge signal may have a magnitude that increases while applying the enable signal to the control gates of all of the memory cell transistors of the string.

BRIEF DESCRIPTION OF THE DRAWINGS

FIG. 2 is a table listing voltage conditions provided during Erase, Program, and Read operations for the nonvolatile memory device of FIGS. 1A and 1B FIGS. 3 and 4 are cross sectional views of an individual memory cell transistor of FIGS. 1A and 1B during erase and subsequent operations.

DETAILED DESCRIPTION

Figure 1A:
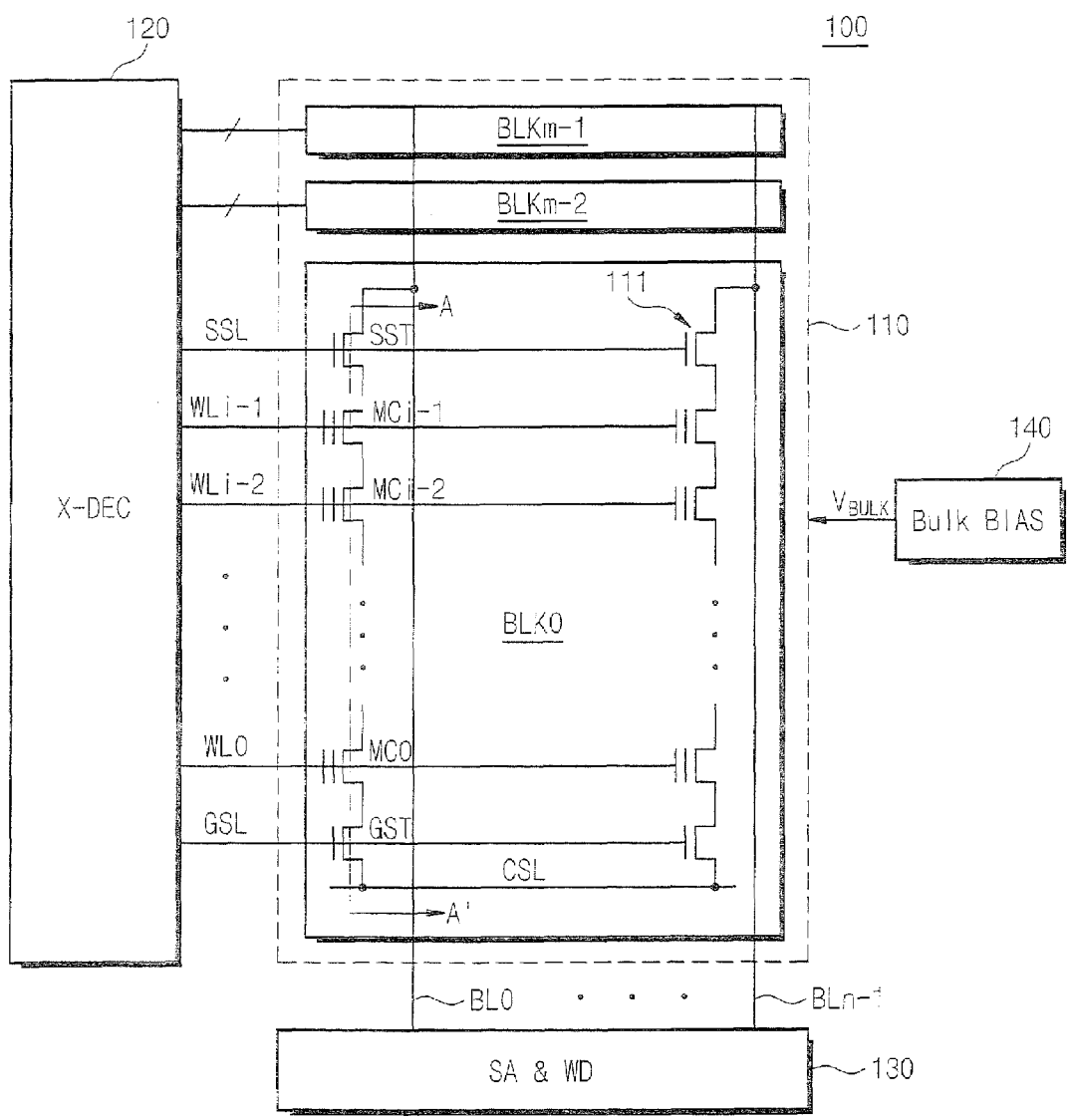
FIG. 1A is a schematic diagram illustrating a conventional nonvolatile memory device.
Figure 1B:
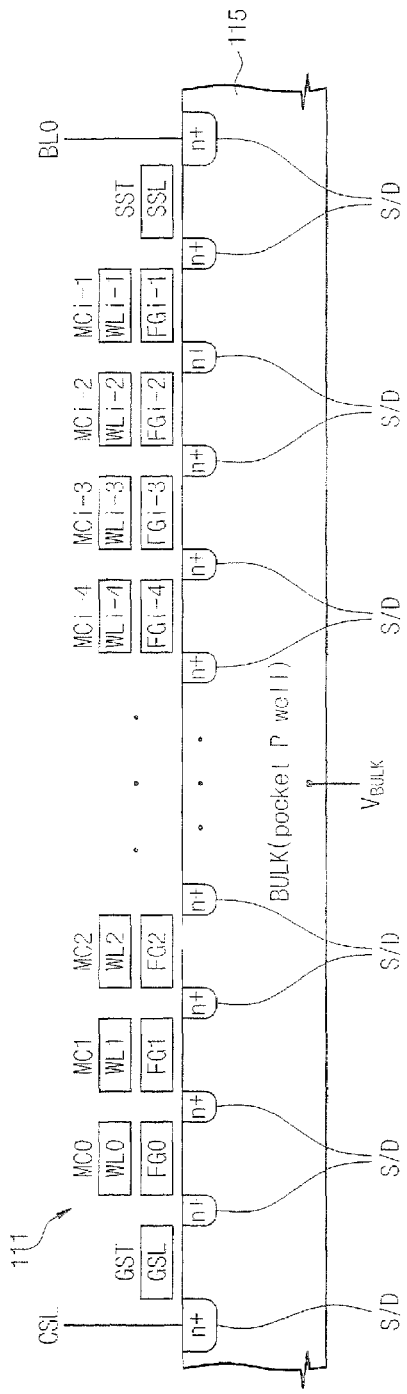
FIG. 1B is a cross-sectional view of a string of memory cell transistors taken along section line A-A' of the block diagram of FIG. 1A.
Figure 3:
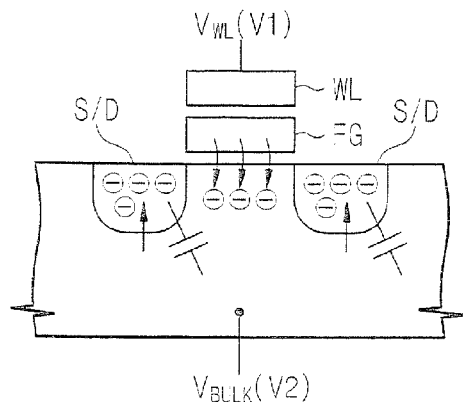
Figure 4:
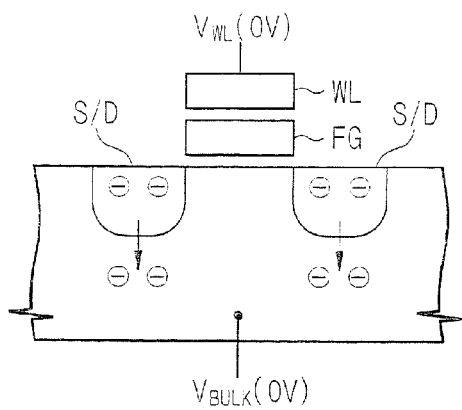

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 5A:
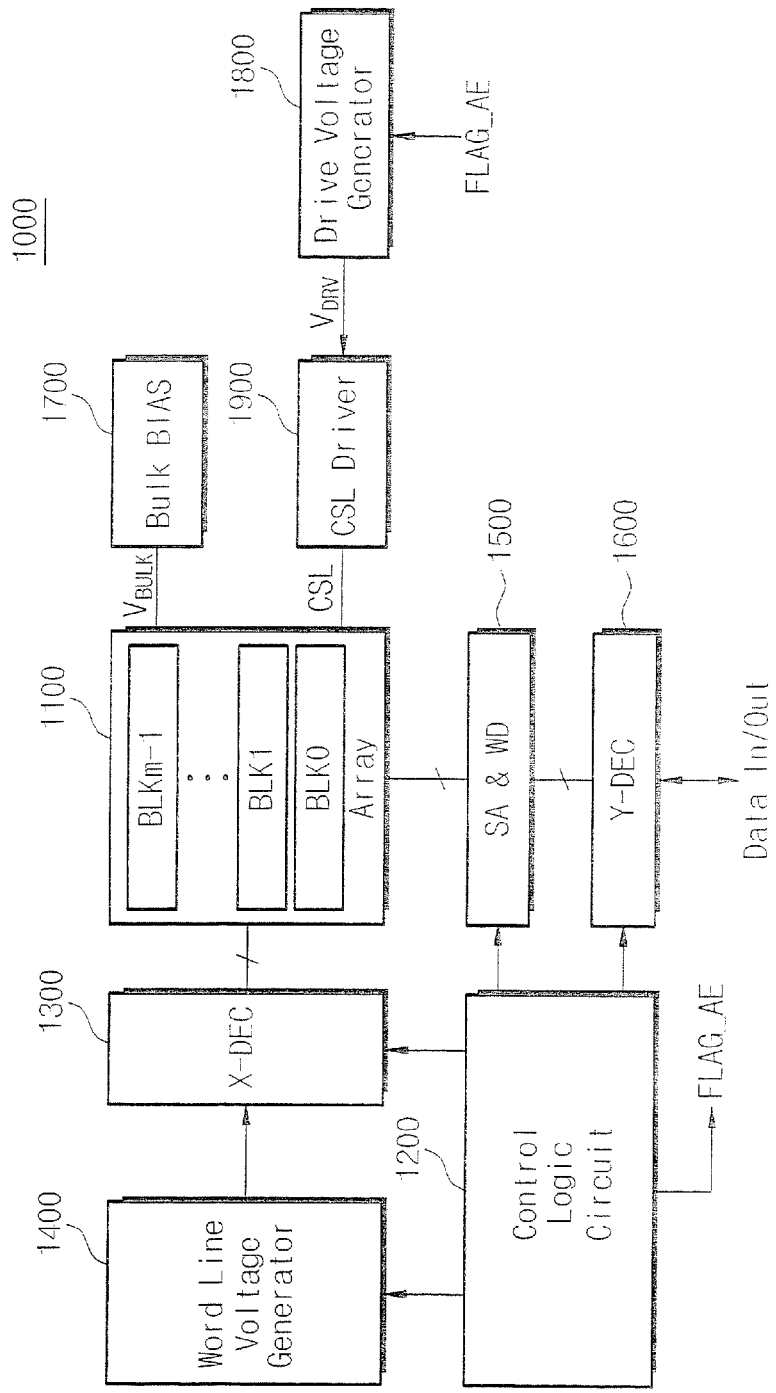
FIG. 5A is a block diagram of a nonvolatile flash memory device according to first embodiments of the present invention.

FIG. 5A is a block diagram of a nonvolatile flash memory device 1000 according to first embodiments of the present invention. As shown in FIG. 5A, the nonvolatile flash memory device 1000 may include a memory cell array 1100, a control logic circuit 1200, a row decoder (X-DEC) 1300, a word line voltage generator 1400, a sense amplifier and write driver (SA & WD) 1500, a column decoder (Y-DEC) 1600, a bulk bias driver 1700, a drive voltage generator 1800, and a common source line (CSL) driver 1900. Moreover, the memory cell array 1100 may include a plurality of blocks of nonvolatile flash memory cell transistors, and each block of nonvolatile flash memory cell transistors may be arranged in strings of memory cell transistors.

Figure 5B:
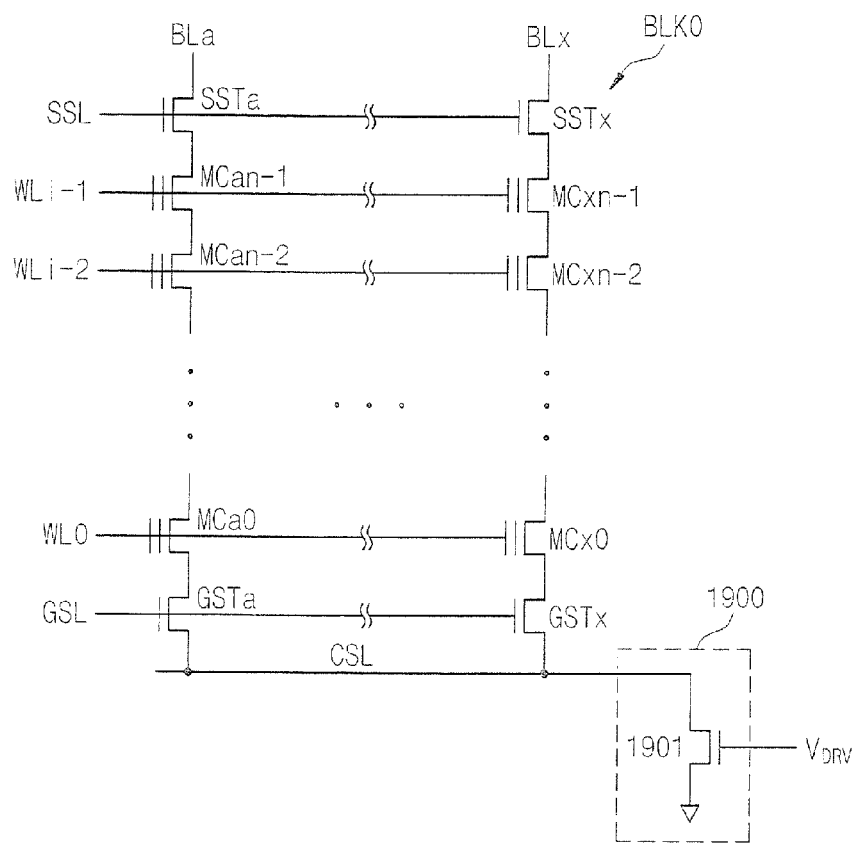
FIG. 5B is a schematic diagram illustrating a block of nonvolatile memory cell transistors from the memory cell array of FIG. 5A.

FIG. 5B is a schematic diagram illustrating a block (such as block BLK0) of nonvolatile memory cell transistors from the memory cell array 1100 of FIG. 5A. As shown in FIG. 5B, the memory cell array 1100 may include multiple strings of non-volatile memory cell transistors with each string coupled between a respective bit line BLa to BLx and a common source line CSL. More particularly, each string may include a plurality of memory cell transistors (such as nonvolatile memory cell transistors MCa0 to MCan−1 or nonvolatile memory cell transistors MCx0 to MCxn−1) serially coupled in a string between a respective string selection transistor (such as string selection transistor SSTa or string selection transistor SSTx) and a respective ground selection transistor (such as ground selection transistor GSTa or string selection transistor GSTx). Each string selection transistor (such as string selection transistor SSTa or string selection transistor SSTx) is coupled between the respective string of memory cell transistors and the respective bit line (such as bit line BLa or bit line BLx). Each ground selection transistor (such as ground selection transistor GSTa or ground selection transistor GSTx) is coupled between the respective string of memory cell transistors and the common source line CSL.

Figure 5C:
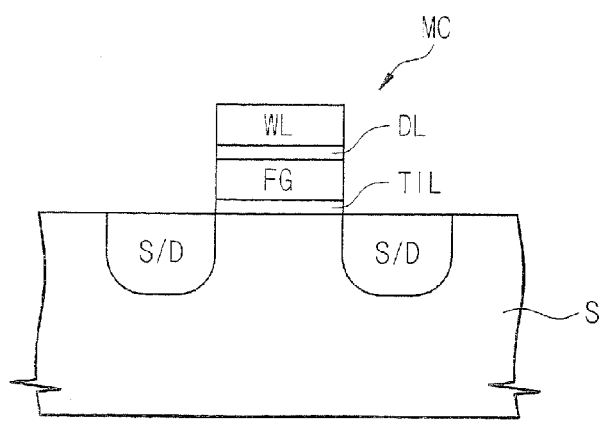
FIG. 5C is a cross-sectional view illustrating a nonvolatile memory cell transistor of FIG. 5B.

As further shown in FIG. 5C, each nonvolatile memory cell transistor MC of FIG. 5B may include a floating gate FG between a control gate electrode (provided as a portion of a word line WL) and a p-well region of semiconductor substrate S, and n-type source/drain regions S/D of the semiconductor substrate S may be provided on opposite sides of the control gate electrode WL. Moreover, the blocks BLK0 to BLKm−1 of memory cell transistors of FIG. 5A may be provided in a same p-well region of the substrate S. Accordingly, the bulk bias driver 1700 of FIG. 5A may drive the p-well region to different voltages.

As further shown in FIGS. 5A and 5B, the CSL driver 1900 may include a CSL driver transistor 1901 electrically coupled between a respective common source line CSL and a reference voltage such as a reference ground voltage (e.g., 0 volts). A respective CSL driver transistor 1901, for example, may be provided for each block of memory cells. Moreover, a control gate of the CSL driver transistor may be coupled to the control signal $V_{DRV}$ generated by the drive voltage generator 1800.

During program and read operations, the voltage conditions of FIG. 2 may be applied so that the common source line CSL is electrically coupled to the ground reference voltage (e.g., 0 volts) though the CSL driver transistor 1901. Stated in other words, the drive voltage generator 1800 may apply a drive signal $V_{DRV}$ (to the control gate electrode of the CSL driver transistor 1901 of the selected block) sufficient turn the CSL driver transistor 1901 on in a saturation mode of operation during program and read/verify operations. During an erase operation, the CSL driver transistor 1901 may be turned off so that the common source line CSL is electrically isolated from the reference ground voltage. The common source line CSL may thus float electrically during an erase operation as shown in FIG. 2.

According to embodiments of the present invention, an erase operation may be followed by a discharge operation used to discharge positive charge in source/drain regions of memory cell transistors that have been erased. By performing the discharge operation after an erase operation and before any program and/or read/verify operations, soft programming (for example, due to impact ionization) may be reduced. Without such a discharge operation, residual positive charge may remain in source/drain regions after an erase operation, and voltage potentials resulting between source/drain regions of memory cell transistors due to the residual positive charge may cause undesired soft charging/programming of floating gates due to impact ionization.

An erase operation may be initiated by the control logic circuit 1200 responsive to an erase command with respect to memory cell transistors MC of block BLK0 of FIG. 5B. Responsive to the control logic circuit 1200: a negative 7 volt signal may be applied from the word line voltage generator 1400 through the row decoder 1300 to each of the word lines WL0 to WLi−1 of block BLK0; a positive 10 volt signal may be applied from the bulk bias driver 1700 to the p-well of the memory cell array; a reference ground voltage signal (e.g. 0 volts) may be applied from the drive voltage generator 1800 to the control gate electrode of the CSL driver transistor 1900 so that the common source line CSL floats electrically (i.e., the common source line is electrically isolated from the reference ground voltage); the string and ground selection lines SSL and GSL may be decoupled from the word line voltage generator 1400 at the row decoder 1300 so that the string and ground selection lines SSL and GSL float electrically; and the bit lines BLa to BLx may be decoupled at the SA&WD 1500 and/or from the column decoder 1600 so that the bit lines BLa to BLx electrically float. During the block erase operation used to erase memory cell transistors of the block BLK0, word lines, string selection lines, ground selection lines, and common source lines of non-selected blocks (i.e., blocks not being erased) may be allowed to float electrically so that memory cell transistors of the non-selected blocks are not erased.

During the erase operation, negative charge may be driven from floating gates FG of the memory cell transistors MC of the selected block BLK0 thereby erasing the memory cell transistors MC of the selected block BLK0 to the "1" state. Positive electrical charge, however, may remain at the source/drain regions S/D of the memory cell transistors MC of the selected block BLK0. A discharge operation may thus be performed after the erase operation to reduce/remove any charge remaining at the source/drain regions S/D of the memory cell transistors MC.

Further responsive to the erase command and after completing the erase operations discussed above, the control logic circuit 1200 may initiate the discharge operation. Responsive to the control logic circuit 1200, electrical charge from the source/drain regions S/D of the memory cell transistors MC may be discharged through the ground selection transistors GST, the common source line CSL, and the CSL driver transistor 1901 to the reference ground.

More particularly, an enable signal may be applied by the word line voltage generator 1400 and the row decoder 1300 to the ground selection line GSL and the word lines WL for the block BLK0 being erased, and then, a discharge signal may be applied by the drive voltage generator 1800 to a control gate of the CSL driver transistor 1901 responsive to an erase done flag FLAG_AE generated by the control logic circuit 1200. More particularly, the discharge signal may have a magnitude that is less than a magnitude of the enable signal and/or a magnitude that increases during at least a portion of the discharging operation. After turning on the memory cell transistors MC of the strings and the respective ground selection transistors GST of the erased block BLK0 during the discharge operation, discharge of positive electrical charge from the source/drain regions S/D of the memory cells may be controlled through the CSL driver transistor.

The enable signal applied to the word lines WL and ground selection line GSL during the discharge operation may be, for example, the same as a read voltage Vread used for read operations as discussed above with respect to FIG. 2 and/or a power supply voltage (e.g., Vcc) for the memory device 1000. Moreover, the enable signal may be maintained at a substantially stable voltage from before initiating the discharge signal used to turn on the CSL driver transistor 1901 until after the discharge signal has been initiated and even until after the discharge operation has been completed.

Figure 6A:
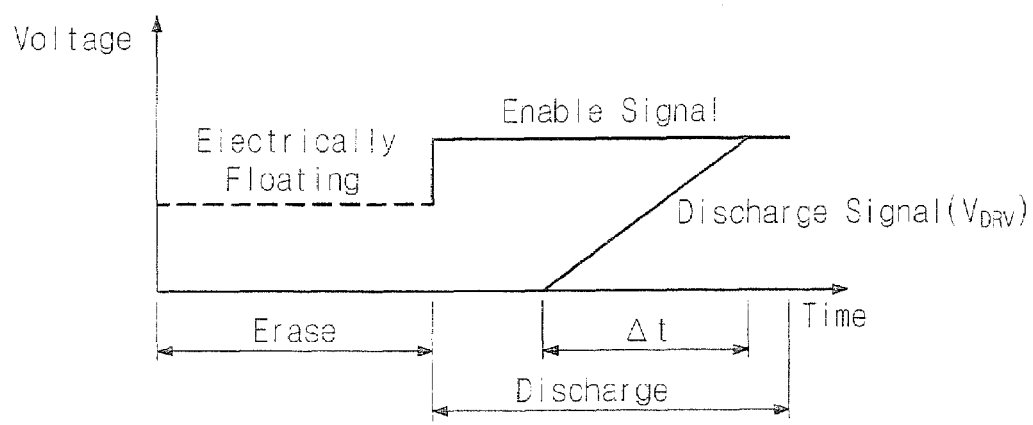
FIGS. 6A, 6B, and 6C are signal diagrams illustrating discharge signals according to embodiments of the present invention.

As shown in the signal diagram of FIG. 6A, the enable signal may be initiated on completing the erase operation, and the discharge signal may be initiated after initiating the enable signal. More particularly, the discharge signal may have a ramp profile that increases over time from a relatively low voltage (e.g., in the range of about 0 volts to about 0.7 volts) to a greater voltage (e.g., the voltage of the enable signal and/or the power supply voltage Vcc). A time of ramping the discharge signal (from initiating the discharge signal till reaching a steady voltage) may be at least about 0.5 µs (microseconds), and more particularly, at least about 1 µs (microsecond). While a linear ramp profile is shown in FIG. 6A by way of example, other profiles (e.g., exponential, stepped, etc.) may be used.

Figure 6B:
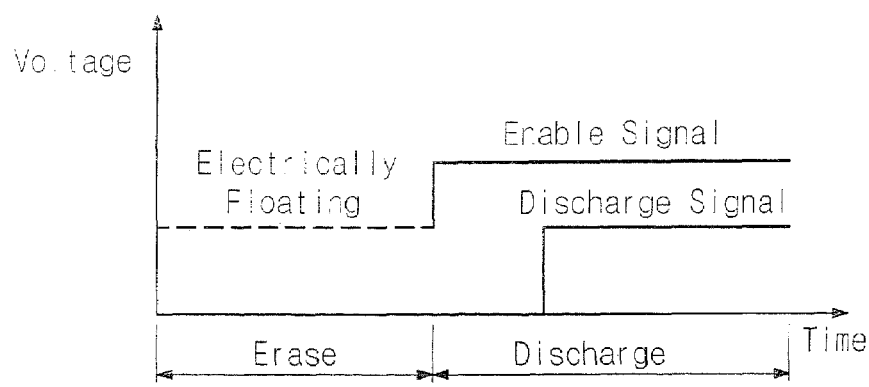

As shown in the signal diagram of FIG. 6B, the enable signal may be initiated on completing the erase operation, and the discharge signal may be initiated after initiating the enable signal. In FIG. 6B, however, the discharge signal may be a constant voltage signal having a voltage less than that of the enable signal.

Figure 6C:
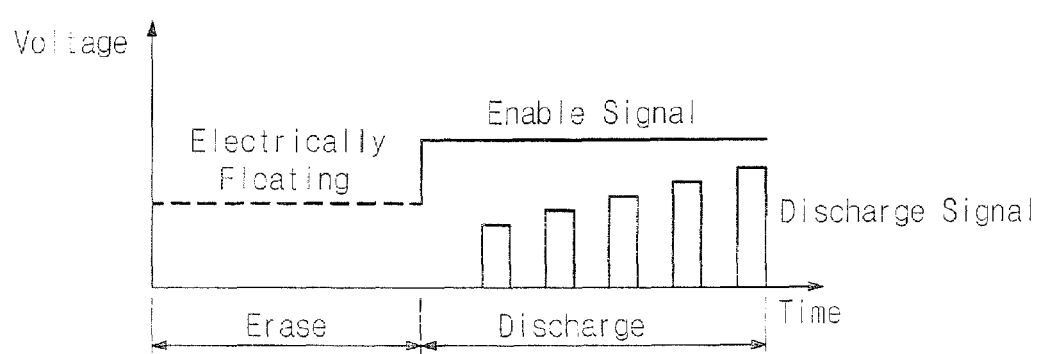

As shown in the signal diagram of FIG. 6C, the enable signal may be initiated on completing the erase operation, and the discharge signal may be initiated after initiating the enable signal. In FIG. 6C, however, the discharge signal may be a pulsed signal having a voltage less than that of the enable signal. While a voltage of each sequential pulse increases in the example of FIG. 6C, each pulse may have a same voltage according to other embodiments of the present invention. Moreover, pulse widths and/or intervals between pulses may be the same, and/or pulse widths and/or intervals between pulse widths may vary. For example, pulse widths of the discharge signal may increase with successive pulses and/or intervals between pulses may decrease with successive pulses.

By moderating (e.g., slowing) discharge through the CSL drive transistor 1901 during the discharge operation, impact ionization in the channel regions of the memory cell transistors MC may be reduced after an erase operation thereby reducing soft programming after an erase operation. While particular profiles for the discharge signal are shown in FIGS. 6A, 6B and 6C by way of example, other profiles may be used. For example, a profile for the discharge signal may be selected so that a difference between voltages of source/drain regions of memory cell transistors (e.g., MCa0 to MCx0) adjacent the ground selection transistors GSTa to GSTx does not exceed 2 volts. By providing that a voltage difference between source/drain regions of a memory cell transistor does not exceed 2 volts, impact ionization may be reduced during discharge.

During the discharge operation, the memory cell transistors MC and the ground selection transistors GST may be fully turned on (i.e., in saturation mode) responsive to the enable signal, while the CSL drive transistor 1901 is operated in linear mode to moderate and/or slow discharge, to reduce impact ionization in channel regions of the memory cell transistors, and/or to reduce a difference between voltages of source/drain regions of memory cell transistors.

The discharge operation may be performed before any other operation for the memory cell transistors of the erased block after erasing the memory cell transistors of the block. More particularly, the discharge operation may be performed before any program, read, and/or verify operation for the memory cell transistors of the block after erasing the memory cell transistors of the block. After discharging electrical charge from the source/drain regions of the memory cell transistors, an erase verify operation may be performed for the memory cell transistors of the block. The erase verify operation, for example, may be performed using conditions similar to those of the read operation of FIG. 2.

As shown in FIG. 5B a block BLK0 of memory cell transistors may include a first string of memory cell transistors MCa0 to MCan−1 serially coupled between ground and string selection transistors GSTa and SSTa, and a second string of memory cell transistors MCx0 to MCxn−1 serially coupled between ground and string selection transistors GSTx and SSTx. The ground selection transistors GSTa and GSTx may be electrically coupled between the respective strings of memory cell transistors (MCa0 to MCan−1 and MCx0 to MCxn−1) and the same common source line CSL. The string selection transistors SSTa and SSTx may be electrically coupled between the respective strings of memory cell transistors (MCa0 to MCan−1 and MCx0 to MCxn−1) and different bit lines BLa and BLx. While two strings of memory cell transistors are explicitly shown in the block BLK0 of FIG. 5B, any number of strings of memory cell transistors may be provided between the two strings shown sharing the same ground and string selection lines GSL and SSL, sharing the same word lines WL0 to Wli−1, and sharing the same common source line CSL.

Accordingly, simultaneous erase operations and then simultaneous discharge operations discussed above may be performed with respect to all memory cell transistors of the same block (e.g., block BLK0) including memory cell transistors MCa0 to MCan−1 and MCx0 to MCxn−1 and any other memory cell transistors sharing the word lines WL0 to WLn−1. More particularly, during the discharge operation, electrical charge from the source/drain regions of the memory cell transistors MCa0 to MCan−1 of the first string may be discharged through the first ground selection transistor GSTa to the common source line CSL, and electrical charge from the source/drain regions of the memory cell transistors MCx0 to MCxn−1 of the second string may be discharged through the second ground selection transistor GSTx to the common source line CSL.

Moreover, the structure of FIG. 5B discussed above with respect to block BLK0 of FIG. 5A may be repeated in each of blocks BLK1 to BLKm−1 so that each memory cell block has a same number of strings of memory cell transistors and with each string having a same number of memory cell transistors. Moreover, the bit lines BLa to BLx may be shared across all of the blocks BLK0 to BLKm−1 with strings of different blocks in a same column sharing a same bit line. Each block may include a string selection line, a ground selection line, and a plurality of word lines unique to that block and all separately coupled to the row decoder 1300 and/or the word line voltage generator 1400. Moreover, each block may include a respective common source line coupled to a respective CSL drive transistor. Accordingly, erase and discharge operations may be performed for one of the blocks of memory cells without erasing and/or discharging any memory cells of any other blocks by separately controlling the different word lines, string selection lines, ground selection lines, and CSL drive transistors of the different blocks.

According to other embodiments of the present invention, simultaneous erase operations and then simultaneous discharge operations may be performed for two or more blocks of the memory cell array 1100. For example, strings of memory cell transistors in the block BLK0 may be respectively coupled to the bit lines BLa to BLx, strings of memory cell transistors in the block BLK1 may be respectively coupled to the same bit lines BLa to BLx, and all of the blocks BLK0 to BLKm−1 may be provided in a same p-well of the semiconductor substrate. All memory cell transistors of the blocks BLK0 and BLK1 may be erased simultaneously by applying the negative 7 volt erase signal to the word lines WL of the blocks BLK0 and BLK1 while allowing word lines WL of other blocks to float electrically. All memory cell transistors of the blocks BLK0 and BLK1 may then be discharged simultaneously by applying the enable and discharge signals as discussed above with respect to FIGS. 6A, 6B, and 6C. Accordingly, memory cell transistors of each block BLK0 and BLK1 may be simultaneously discharged through respective ground selection transistors, common source lines, and CSL driver transistors. While simultaneous erase operations and then simultaneous discharge operations are discussed by way of example with respect to adjacent blocks of the memory cell array, simultaneous erase operations and simultaneous discharge operations may be performed for non-adjacent blocks according to embodiments of the present invention.

Figure 7:
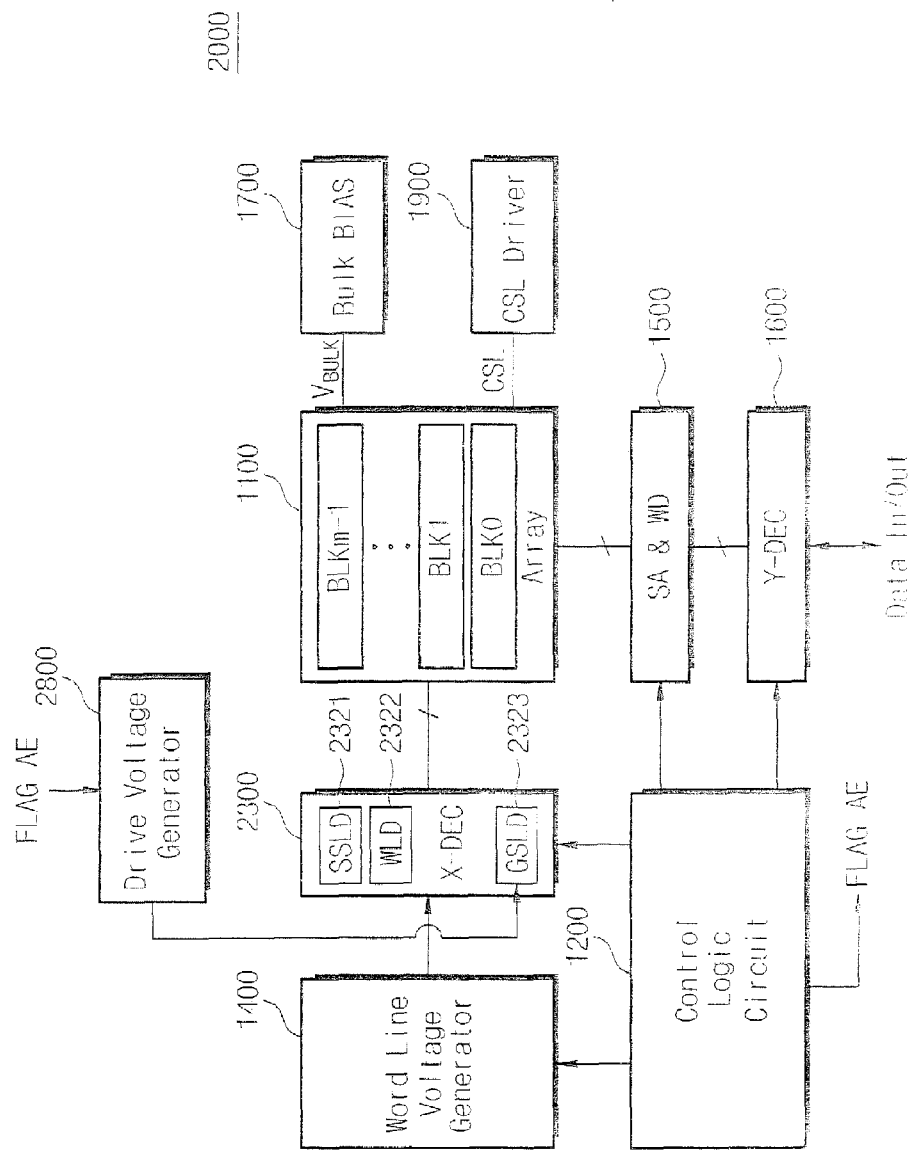
FIG. 7 is a block diagram of a nonvolatile flash memory device according to second embodiments of the present invention.

FIG. 7 is a block diagram of a nonvolatile flash memory device 2000 according to second embodiments of the present invention. As shown in FIG. 7, the nonvolatile flash memory device 2000 may include a memory cell array 1100, a control logic circuit 1200, a word line voltage generator 1400, a sense amplifier and write driver (SA & WD) 1500, a column decoder (Y-DEC) 1600, a bulk bias driver 1700, and a common source line (CSL) driver 1900 as discussed above with respect to FIG. 5A. Moreover, the memory cell array 1100 may include a plurality of blocks BLK0 to BLKm−1 of nonvolatile flash memory cell transistors, and each block of nonvolatile flash memory cell transistors may be arranged in strings of memory cell transistors.

The structure of each block of memory cell transistors may be that same as that discussed above with respect to FIGS. 5B and 5C, with the exception that the control gate electrode of the CSL driver transistor 1901 is not driven by the drive voltage generator according to the second embodiments of the present invention. Instead, the control gate electrode of the CSL driver transistor may be controlled to turn the CSL driver transistor off so that the common source line CSL is electrically decoupled from the reference ground voltage, or to turn the CSL driver transistor on (in saturation) so that the common source line is electrically coupled to the reference ground voltage. Further discussion of the structure of the block of memory cell transistors will be omitted for the sake of conciseness.

As shown in FIG. 7, the row decoder (X-DEC) 2300 may include a string selection line driver 2321, a word line driver WLD 2322, and a ground selection line driver (GSLD) 2323. Moreover, the drive voltage generator 2800 may provide a voltage signal used by the ground selection line driver (GSLD) 2323 to drive the ground selection line (GSL) of an erased block during a discharge operation following an erase operation.

Operations of the memory device 2000 will now be discussed with reference to FIGS. 7 and 5B. During program and read operations, the voltage conditions of FIG. 2 may be applied so that the common source line CSL is electrically coupled to the ground reference voltage (e.g., 0 volts) though the CSL driver transistor 1901. Stated in other words, a control signal may be applied to the control gate electrode of the CSL driver transistor 1901 sufficient turn the CSL driver transistor 1901 on in a saturation mode of operation during program and read/verify operations. During an erase operation, the CSL driver transistor 1901 may be turned off so that the common source line CSL is electrically isolated from the reference ground voltage. The common source line CSL may thus float electrically during an erase operation as shown in FIG. 2. In addition, the ground selection line GSL may be allowed to float during the erase operation.

The erase operation may be followed by a discharge operation used to discharge positive charge in source/drain regions of memory cell transistors that have been erased. By performing the discharge operation after an erase operation and before any program and/or read/verify operations, soft programming (for example, due to impact ionization) may be reduced. Without such a discharge operation, residual positive charge may remain in source/drain regions after an erase operation, and voltage potentials resulting between source/drain regions of memory cell transistors due to the residual positive charge may cause undesired soft charging/programming of floating gates due to impact ionization.

An erase operation may be initiated by the control logic circuit 1200 responsive to an erase command with respect to memory cell transistors MC of block BLK0 of FIG. 5B. Responsive to the control logic circuit 1200: a negative 7 volt signal may be applied from the word line voltage generator 1400 through the word line driver 2322 to each of the word lines WL0 to WLi−1 of block BLK0; a positive 10 volt signal may be applied from the bulk bias driver 1700 to the p-well of the memory cell array; a reference ground voltage signal (e.g., 0 volts) may be applied to the control gate electrode of the CSL driver transistor 1901 so that the common source line CSL floats electrically (i.e., the common source line is electrically isolated from the reference ground voltage); the string and ground selection lines SSL and GSL may be decoupled from the word line voltage generator 1400 and/or the drive voltage generator 2800 at the row decoder 2300 so that the string and ground selection lines SSL and GSL float electrically; and the bit lines BLa to BLx may be decoupled at the SA&WD 1500 and/or from the column decoder 1600 so that the bit lines BLa to BLx float electrically. During the block erase operation used to erase memory cell transistors of the block BLK0, word lines, string selection lines, ground selection lines, and common source lines of non-selected blocks (i.e., blocks not being erased) may be allowed to float electrically so that memory cell transistors of the non-selected blocks are not erased.

During the erase operation, negative charge may be driven from floating gates FG of the memory cell transistors MC of the selected block BLK0 thereby erasing the memory cell transistors MC of the selected block BLK0 to the "1" state. Positive electrical charge, however, may remain at the source/drain regions S/D of the memory cell transistors MC of the selected block BLK0. A discharge operation may thus be performed after the erase operation to reduce/remove any charge remaining at the source/drain regions S/D of the memory cell transistors MC.

Further responsive to the erase command and after completing the erase operations discussed above, the control logic circuit 1200 may initiate the discharge operation. Responsive to the control logic circuit 1200 of FIG. 7, electrical charge from the source/drain regions S/D of the memory ell transistors MC may be discharged through the ground selection transistors GST, the common source line CSL, and the CSL driver transistor 1901 to the reference ground.

More particularly, an enable signal may be applied by the word line voltage generator 1400, the row decoder 2300, and the word line driver 2322 to the word lines WL and to the control gate electrode of the CSL driver transistor 1901 for the block BLK0 being erased, and then, a discharge signal may be applied by the drive voltage generator 2800 and the ground selection line driver 2323 to the ground selection line GSL for the block BLK0 being erased responsive to an erase done flag FLAG_AE generated by the control logic circuit 1200. More particularly, the discharge signal may have a magnitude that is less than a magnitude of the enable signal and/or a magnitude that increases during at least a portion of the discharging operation. After turning on the memory cell transistors MC of the strings and the CSL driver transistor 1901 of the erased block BLK0 during the discharge operation, discharge of positive electrical charge from the source/drain regions S/D of the memory cells may be controlled through the ground selection transistors GST of the erased block BLK0.

The enable signal applied to the word lines WL and control gate electrode of the CSL driver transistor 1901 during the discharge operation may be, for example, the same as a read voltage Vread used for read operations as discussed above with respect to FIG. 2 and/or a power supply voltage (e.g., Vcc) for the memory device 2000. Moreover, the enable signal may be maintained at a substantially stable voltage from before initiating the discharge signal used to turn on the ground selection transistors GST until after the discharge signal has been initiated and even until after the discharge operation has been completed.

As shown in the signal diagram of FIG. 6A, the enable signal may be initiated on completing the erase operation, and the discharge signal may be initiated after initiating the enable signal. More particularly, the discharge signal may have a ramp profile that increases over time from a relatively low voltage (e.g., in the range of about 0 volts to about 0.7 volts) to a greater voltage (e.g., the voltage of the enable signal and/or the power supply voltage Vcc). A time of ramping the discharge signal (from initiating the discharge signal till reaching a steady voltage) may be at least about 0.5 μs (microseconds), and more particularly, at least about 1 μs (microsecond). While a linear ramp profile is shown in FIG. 6A by way of example, other profiles (e.g., exponential, stepped, etc.) may be used.

As shown in the signal diagram of FIG. 6B, the enable signal may be initiated on completing the erase operation, and the discharge signal may be initiated after initiating the enable signal. In FIG. 6B, however, the discharge signal may be a constant voltage signal having a voltage less than that of the enable signal.

As shown in the signal diagram of FIG. 6C, the enable signal may be initiated on completing the erase operation, and the discharge signal may be initiated after initiating the enable signal. In FIG. 6C, however, the discharge signal may be a pulsed signal having a voltage less than that of the enable signal. While a voltage of each sequential pulse increases in the example of FIG. 6C, each pulse may have a same voltage according to other embodiments of the present invention. Moreover, pulse widths and/or intervals between pulses may be the same, and/or pulse widths and/or intervals between pulse widths may vary. For example, pulse widths of the discharge signal may increase with successive pulses and/or intervals between pulses may decrease with successive pulses.

By moderating (e.g., slowing) discharge through the gate selection transistors GST during the discharge operation, impact ionization in the channel regions of the memory cell transistors MC may be reduced after an erase operation thereby reducing soft programming after an erase operation. While particular profiles for the discharge signal are shown in FIGS. 6A, 6B and 6C by way of example, other profiles may be used. For example, a profile for the discharge signal may be selected so that a difference between voltages of source/drain regions of memory cell transistors (e.g., MCa0 to MCx0) adjacent the ground selection transistors GSTa to GSTx does not exceed 2 volts. By providing that a voltage difference between source/drain regions of a memory cell transistor does not exceed 2 volts, impact ionization may be reduced during discharge.

During the discharge operation, the memory cell transistors MC and the CSL driver transistor 1901 may be fully turned on (i.e., in saturation mode) responsive to the enable signal, while the ground selection transistors GST are operated in linear mode to moderate and/or slow discharge, to reduce impact ionization in channel regions of the memory cell transistors, and/or to reduce a difference between voltages of source/drain regions of memory cell transistors. According to still other embodiments of the present invention, the ground selection transistors GST and the CSL driver transistor 1901 may all be operated in linear mode during the discharge operation and/or portions thereof.

The discharge operation may be performed before any other operation for the memory cell transistors of the erased block after erasing the memory cell transistors of the block. More particularly, the discharge operation may be performed before any program, read, and/or verify operation for the memory cell transistors of the block after erasing the memory cell transistors of the block. After discharging electrical charge from the source/drain regions of the memory cell transistors, an erase verify operation may be performed for the memory cell transistors of the block. The erase verify operation, for example, may be performed using conditions similar to those of the read operation of FIG. 2.

As shown in FIG. 5B a block BLK0 of memory cell transistors may include a first string of memory cell transistors MCa0 to MCan−1 serially coupled between ground and string selection transistors GSTa and SSTa, and a second string of memory cell transistors MCx0 to MCxn−1 serially coupled between ground and string selection transistors GSTx and SSTx. The ground selection transistors GSTa and GSTx may be electrically coupled between the respective strings of memory cell transistors (MCa0 to MCan−1 and MCx0 to MCxn−1) and the same common source line CSL. The string selection transistors SSTa and SSTx may be electrically coupled between the respective strings of memory cell transistors (MCa0 to MCan−1 and MCx0 to MCxn−1) and different bit lines BLa and BLx. While two strings of memory cell transistors are explicitly shown in the block BLK0 of FIG. 5B, any number of strings of memory cell transistors may be provided between the two strings shown sharing the same ground and string selection lines GSL and SSL, sharing the same word lines WL0 to Wli−1, and sharing the same common source line CSL.

Accordingly, simultaneous erase operations and then simultaneous discharge operations discussed above with respect to FIG. 7 may be performed with respect to all memory cell transistors of the same block (e.g. block BLK0) including memory cell transistors MCa0 to MCan−1 and MCx0 to MCxn−1 and any other memory cell transistors sharing the word lines WL0 to WLn−1. More particularly, during the discharge operation, electrical charge from the source/drain regions of the memory cell transistors MCa0 to MCan−1 of the first string may be discharged through the first ground selection transistor GSTa to the common source line CSL, and electrical charge from the source/drain regions of the memory cell transistors MCx0 to MCxn−1 of the second string may be discharged through the second ground selection transistor GSTx to the common source line CSL.

Moreover, the structure of FIG. 5B discussed above with respect to block BLK0 of FIG. 7 may be repeated in each of blocks BLK1 to BLKm−1 so that each memory cell block has a same number of strings of memory cell transistors and with each string having a same number of memory cell transistors. Moreover, the bit lines BLa to BLx may be shared across all of the blocks BLK0 to BLKm−1 with strings of different blocks in a same column sharing a same bit line. Each block may include a string selection line, a ground selection line and a plurality of word lines unique to that block and all separately coupled to the row decoder 2300 and/or the word line voltage generator 1400. Moreover, each block may include a respective common source line coupled to a respective CSL drive transistor. Accordingly, erase and discharge operations may be performed for one of the blocks of memory cells without erasing and/or discharging any memory cells of any other blocks by separately controlling the different word lines, string selection lines, ground selection lines, and CSL drive transistors of the different blocks.

According to other embodiments of the present invention, simultaneous erase operations and then simultaneous discharge operations may be performed for two or more blocks of the memory cell array 1100. For example, strings of memory cell transistors in the block BLK0 may be respectively coupled to the bit lines BLa to BLx, strings of memory cell transistors in the block BLK1 may be respectively coupled to the same bit lines BLa to BLx, and all of the blocks BLK0 to BLKm−1 may be provided in a same p-well of the semiconductor substrate. All memory cell transistors of the blocks BLK0 and BLK1 may be erased simultaneously by applying the negative 7 volt erase signal to the word lines WL of the blocks BLK0 and BLK1 while allowing word lines WL of other blocks to float electrically. All memory cell transistors of the blocks BLK0 and BLK1 may then be discharged simultaneously by applying the enable and discharge signals as discussed above with respect to FIGS. 6A, 6B, and 6C. Accordingly, memory cell transistors of each block BLK0 and BLK1 may be simultaneously discharged through respective ground selection transistors, common source lines, and CSL driver transistors. While simultaneous erase operations and then simultaneous discharge operations are discussed by way of example with respect to adjacent blocks of the memory cell array, simultaneous erase operations and the simultaneous discharge operations may be performed for non-adjacent blocks according to embodiments of the present invention.

Figure 8:
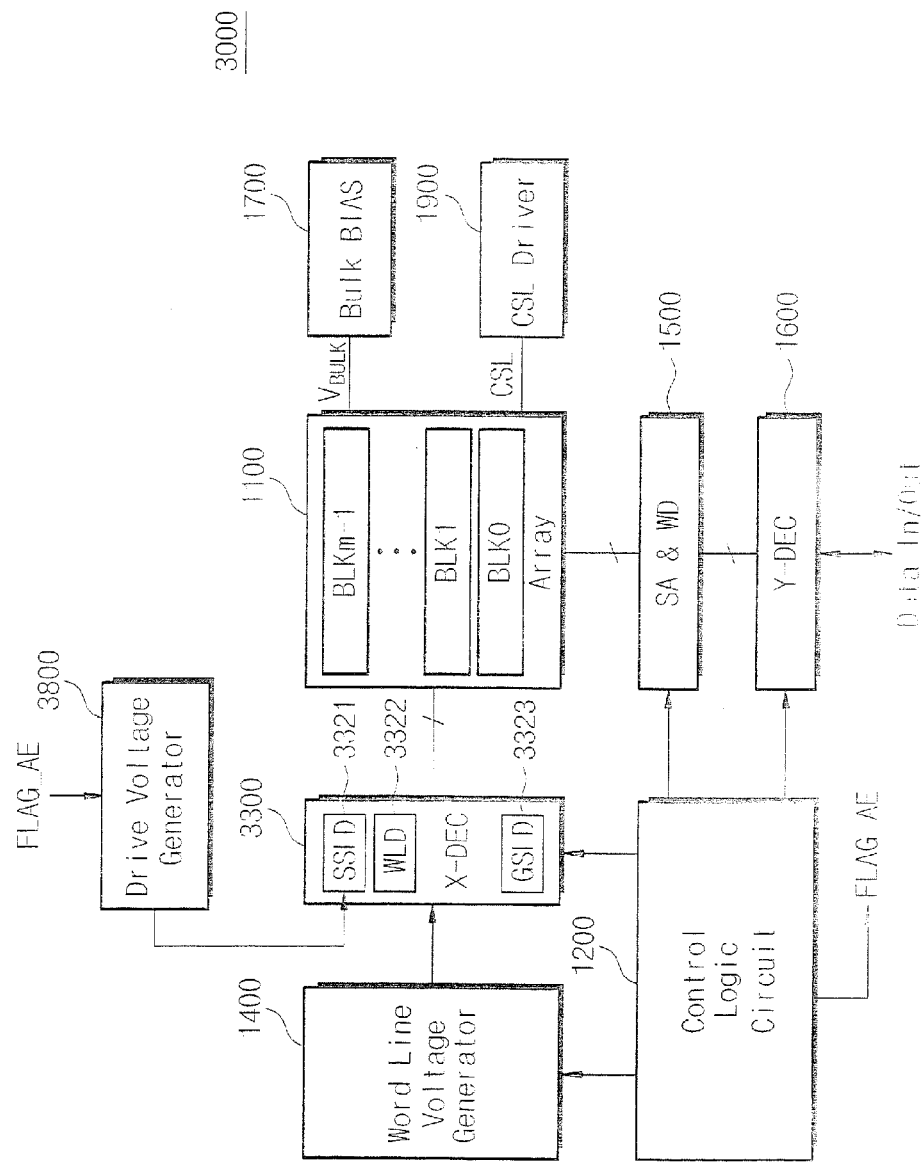
FIG. 8 is a block diagram of a nonvolatile flash memory device according to third embodiments of the present invention.

FIG. 8 is a block diagram of a nonvolatile flash memory device 3000 according to third embodiments of the present invention. As shown in FIG. 8, the nonvolatile flash memory device 3000 may include a memory cell array 1100, a control logic circuit 1200, a word line voltage generator 1400, a sense amplifier and write driver (SA & WD) 1500, a column decoder (Y-DEC) 1600, a bulk bias driver 1700, and a common source line (CSL) driver 1900 as discussed above with respect to FIG. 5A. Moreover, the memory cell array 1100 may include a plurality of blocks BLK0 to BLKm−1 of nonvolatile flash memory cell transistors, and each block of nonvolatile flash memory cell transistors may be arranged in strings of memory cell transistors.

The structure of each block of memory cell transistors may be that same as that discussed above with respect to FIGS. 5B and 5C, with the exception that the control gate electrode of the CSL driver transistor 1901 is not driven by the drive voltage generator according to the third embodiments of the present invention. Instead, the control gate electrode of the CSL driver transistor may be controlled to turn the CSL driver transistor off so that the common source line CSL is electrically decoupled from the reference ground voltage, or to turn the CSL driver transistor on (in saturation) so that the common source line is electrically coupled to the reference ground voltage. Further discussion of the structure of the block of memory cell transistors will be omitted for the sake of conciseness.

As shown in FIG. 8, the row decoder (X-DEC) 3300 may include a string selection line driver 3321, a word line driver WLD 3322, and a ground selection line driver (GSLD) 3323. Moreover, the drive voltage generator 3800 may provide a voltage signal used by the string selection line driver (SSLD) 3323 to drive the string selection line (SSL) of an erased block during a discharge operation following an erase operation.

Operations of the memory device 3000 will now be discussed with reference to FIGS. 8 and 5B. During program and read operations, the voltage conditions of FIG. 2 may be applied so that the common source line CSL is electrically coupled to the ground reference voltage (e.g., 0 volts) though the CSL driver transistor 1901. Stated in other words, a control signal may be applied to the control gate electrode of the CSL driver transistor 1901 sufficient turn the CSL driver transistor 1901 on in a saturation mode of operation during program and read/verify operations. During an erase operation, the CSL driver transistor 1901 may be turned off so that the common source line CSL is electrically isolated from the reference ground voltage. The common source line CSL may thus float electrically during an erase operation as shown in FIG. 2. In addition, the ground and string selection lines GSL and SSL may be allowed to float during the erase operation.

The erase operation may be followed by a discharge operation used to discharge positive charge in source/drain regions of memory cell transistors that have been erased. By performing the discharge operation after an erase operation and before any program and/or read/verify operations, soft programming (for example, due to impact ionization) may be reduced. Without such a discharge operation, residual positive charge may remain in source/drain regions after an erase operation, and voltage potentials resulting between source/drain regions of memory cell transistors due to the residual positive charge may cause undesired soft charging/programming of floating gates due to impact ionization.

An erase operation may be initiated by the control logic circuit 1200 responsive to an erase command with respect to memory cell transistors MC of block BLK0 of FIG. 5B. Responsive to the control logic circuit 1200: a negative 7 volt signal may be applied from the word line voltage generator 1400 through the word line driver 3322 to each of the word lines WL0 to WLi−1 of block BLK0; a positive 10 volt signal may be applied from the bulk bias driver 1700 to the p-well of the memory cell array; a reference ground voltage signal (e.g., 0 volts) may be applied to the control gate electrode of the CSL driver transistor 1901 so that the common source line CSL floats electrically (i.e., the common source line is electrically isolated from the reference ground voltage); the string and ground selection lines SSL and GSL may be decoupled from the word line voltage generator 1400 and/or the drive voltage generator 3800 at the row decoder 3300 so that the string and ground selection lines SSL and GSL float electrically; and the bit lines BLa to BLx may be decoupled at the SA&WD 1500 and/or from the column decoder 1600 so that the bit lines BLa to BLx float electrically. During the block erase operation used to erase memory cell transistors of the block BLK0, word lines, string selection lines, ground selection lines, and common source lines of non-selected blocks (i.e., blocks not being erased) may be allowed to float electrically so that memory cell transistors of the non-selected blocks are not erased.

During the erase operation, negative charge may be driven from floating gates FG of the memory cell transistors MC of the selected block BLK0 thereby erasing the memory cell transistors MC of the selected block BLK0 to the "1" state. Positive electrical charge, however, may remain at the source/drain regions S/D of the memory cell transistors MC of the selected block BLK0. A discharge operation may thus be performed after the erase operation to reduce/remove any charge remaining at the source/drain regions S/D of the memory cell transistors MC.

Further responsive to the erase command and after completing the erase operations discussed above, the control logic circuit 1200 may initiate the discharge operation. Responsive to the control logic circuit 1200 of FIG. 8, electrical charge from the source/drain regions S/D of the memory cell transistors MC may be discharged through the string selection transistors SST to the bit lines BLa to BLx.

More particularly, an enable signal may be applied by the word line voltage generator 1400, the row decoder 3300, and the word line driver 3322 to the word lines WL for the block BLK0 being erased, and the bit lines BL0 to BLx may be coupled to the reference ground voltage (e.g., 0 volts). The CSL driver transistor 1901 and/or the ground selection transistors GST for the block BLK0 being erased may be turned off during the discharge operation. Then, a discharge signal may be applied by the drive voltage generator 3800 and the string selection line driver 3321 to the string selection line SSL for the block BLK0 being erased responsive to an erase done flag FLAG_AE generated by the control logic circuit 1200. More particularly, the discharge signal may have a magnitude that is less than a magnitude of the enable signal and/or a magnitude that increases during at least a portion of the discharging operation. After turning on the memory cell transistors MC of the strings of the erased block BLK0 during the discharge operation, discharge of positive electrical charge from the source/drain regions S/D of the memory cells may be controlled through the string selection transistors SST of the erased block BLK0.

The enable signal applied to the word lines WL during the discharge operation may be, for example, the same as a read voltage Vread used for read operations as discussed above with respect to FIG. 2 and/or a power supply voltage (e.g., Vcc) for the memory device 3000. Moreover, the enable signal may be maintained at a substantially stable voltage from before initiating the discharge signal used to turn on the string selection transistors SST until after the discharge signal has been initiated and even until after the discharge operation has been completed.

As shown in the signal diagram of FIG. 6A, the enable signal may be initiated on completing the erase operation, and the discharge signal may be initiated after initiating the enable signal. More particularly, the discharge signal may have a ramp profile that increases over time from a relatively low voltage (e.g., in the range of about 0 volts to about 0.7 volts) to a greater voltage (e.g., the voltage of the enable signal and/or the power supply voltage Vcc). A time of ramping the discharge signal (from initiating the discharge signal till reaching a steady voltage) may be at least about 0.5 µs (microseconds), and more particularly, at least about 1 µs (microsecond). While a linear ramp profile is shown in FIG. 6A by way of example, other profiles (e.g., exponential, stepped, etc.) may be used.

As shown in the signal diagram of FIG. 6B, the enable signal may be initiated on completing the erase operation, and the discharge signal may be initiated after initiating the enable signal. In FIG. 6B, however, the discharge signal may be a constant voltage signal having a voltage less than that of the enable signal.

As shown in the signal diagram of FIG. 6C, the enable signal may be initiated on completing the erase operation, and the discharge signal may be initiated after initiating the enable signal. In FIG. 6C, however, the discharge signal may be a pulsed signal having a voltage less than that of the enable signal. While a voltage of each sequential pulse increases in the example of FIG. 6C, each pulse may have a same voltage according to other embodiments of the present invention. Moreover, pulse widths and/or intervals between pulses may be the same, and/or pulse widths and/or intervals between pulse widths may vary. For example, pulse widths of the discharge signal may increase with successive pulses and/or intervals between pulses may decrease with successive pulses.

By moderating (e.g., slowing) discharge through the string selection transistors SST during the discharge operation, impact ionization in the channel regions of the memory cell transistors MC may be reduced after an erase operation thereby reducing soft programming after an erase operation. While particular profiles for the discharge signal are shown in FIGS. 6A, 6B and 6C by way of example, other profiles may be used. For example, a profile for the discharge signal may be selected so that a difference between voltages of source/drain regions of memory cell transistors (e.g., MCa0 to MCx0) adjacent the ground selection transistors GSTa to GSTx does not exceed 2 volts. By providing that a voltage difference between source/drain regions of a memory cell transistor does not exceed 2 volts, impact ionization may be reduced during discharge.

During the discharge operation, the memory cell transistors MC may be fully turned on (i.e., in saturation mode) responsive to the enable signal, while the string selection transistors GST are operated in linear mode to moderate and/or slow discharge, to reduce impact ionization in channel regions of the memory cell transistors, and/or to reduce a difference between voltages of source/drain regions of memory cell transistors. According to still other embodiments of the present invention, the string selection transistors SST and the ground selection transistors GST may be operated in linear mode during the discharge operation and/or portions thereof (combining elements of the second and third embodiments of the present invention); the string selection transistors SST and the CSL driver transistor 1901 may be operated in linear mode during the discharge operation and/or portions thereof (combining elements of the first and third embodiments of the present invention); and/or the string selection transistors, the ground selection transistors GST, and the CSL driver transistor 1901 may all be operated in linear mode during the discharge operation and/or portions thereof (combining elements of the first, second, and third embodiments of the present invention).

The discharge operation may be performed before any other operation for the memory cell transistors of the erased block after erasing the memory cell transistors of the block. More particularly, the discharge operation may be performed before any program, read, and/or verify operation for the memory cell transistors of the block after erasing the memory cell transistors of the block. After discharging electrical charge from the source/drain regions of the memory cell transistors, an erase verify operation may be performed for the memory cell transistors of the block. The erase verify operation, for example, may be performed using conditions similar to those of the read operation of FIG. 2.

As shown in FIG. 5B, a block BLK0 of memory cell transistors may include a first string of memory cell transistors MCa0 to MCan−1 serially coupled between ground and string selection transistors GSTa and SSTa, and a second string or memory cell transistors MCx0 to MCxn−1 serially coupled between ground and string selection transistors GSTx and SSTx. The ground selection transistors GSTa and GSTx may be electrically coupled between the respective strings of memory cell transistors (MCa0 to MCan−1 and MCx0 to MCxn−1) and the same common source line CSL. The string selection transistors SSTa and SSTx may be electrically coupled between the respective strings of memory cell transistors (MCa0 to MCan−1 and MCx0 to MCxn−1) and different bit lines BLa and BLx. While two strings of memory cell transistors are explicitly shown in the block BLK0 of FIG. 5B, any number of strings of memory cell transistors may be provided between the two strings shown, sharing the same ground and string selection lines GSL and SST, sharing the same word lines WL0 to Wli−1, and sharing the same common source line CSL.

Accordingly, simultaneous erase operations and then simultaneous discharge operations discussed above with respect to FIG. 8 may be performed with respect to all memory cell transistors of the same block (e.g., block BLK0) including memory cell transistors MCa0 to MCan−1 and MCx0 to MCxn−1 and any other memory cell transistors sharing the word lines WL0 to WLn−1. More particularly, during the discharge operation, electrical charge from the source/drain regions of the memory cell transistors MCa0 to MCan−1 of the first string may be discharged through the first string selection transistor SSTa to bit line BLa, and electrical charge from the source/drain regions of the memory cell transistors MCx0 to MCxn−1 of the second string may be discharged through the second string selection transistor SSTx to the bit line BLx.

Moreover, the structure of FIG. 5B discussed above with respect to block BLK0 of FIG. 8 may be repeated in each of blocks BLK1 to BLKm−1 so that each memory cell block has a same number of strings of memory cell transistors and with each string having a same number of memory cell transistors. Moreover, the bit lines BLa to BLx may be shared across all of the blocks BLK0 to BLKm−1 with strings of different blocks in a same column sharing a same bit line. Each block may include a string selection line, a ground selection line, and a plurality of word lines unique to that block and all separately coupled to the row decoder 2300 and/or the word line voltage generator 1400. Moreover, each block may include a respective common source line coupled to a respective CSL drive transistor. Accordingly, erase and discharge operations may be performed for one of the blocks of memory cells without erasing and/or discharging any memory cells of any other blocks by separately controlling the different word lines, string selection lines, ground selection lines, and CSL drive transistors of the different blocks.

According to other embodiments of the present invention, simultaneous erase operations and then simultaneous discharge operations may be performed for two or more blocks of the memory cell array 1100. For example, strings of memory cell transistors in the block BLK0 may be respectively coupled to the bit lines BLa to BLx, strings of memory cell transistors in the block BLK1 may be respectively coupled to the same bit lines BLa to BLx, and all of the blocks BLK0 to BLKm−1 may be provided in a same p-well of the semiconductor substrate. All memory cell transistors of the blocks BLK0 and BLK1 may be erased simultaneously by applying the negative 7 volt erase signal to the word lines WL of the blocks BLK0 and BLK1 while allowing word lines WL of other blocks to float electrically. All memory cell transistors of the blocks BLK0 and BLK1 may then be discharged simultaneously by applying the enable and discharge signals as discussed above with respect to FIGS. 6A, 6B, and 6C. Accordingly, memory cell transistors of each block BLK0 and BLK1 may be simultaneously discharged through respective string selection transistors and bit lines. While simultaneous erase operations and then simultaneous discharge operations are discussed by way of example with respect to adjacent blocks of the memory cell array, simultaneous erase operations and then simultaneous discharge operations may be performed for non-adjacent blocks according to embodiments of the present invention.

Figure 9:
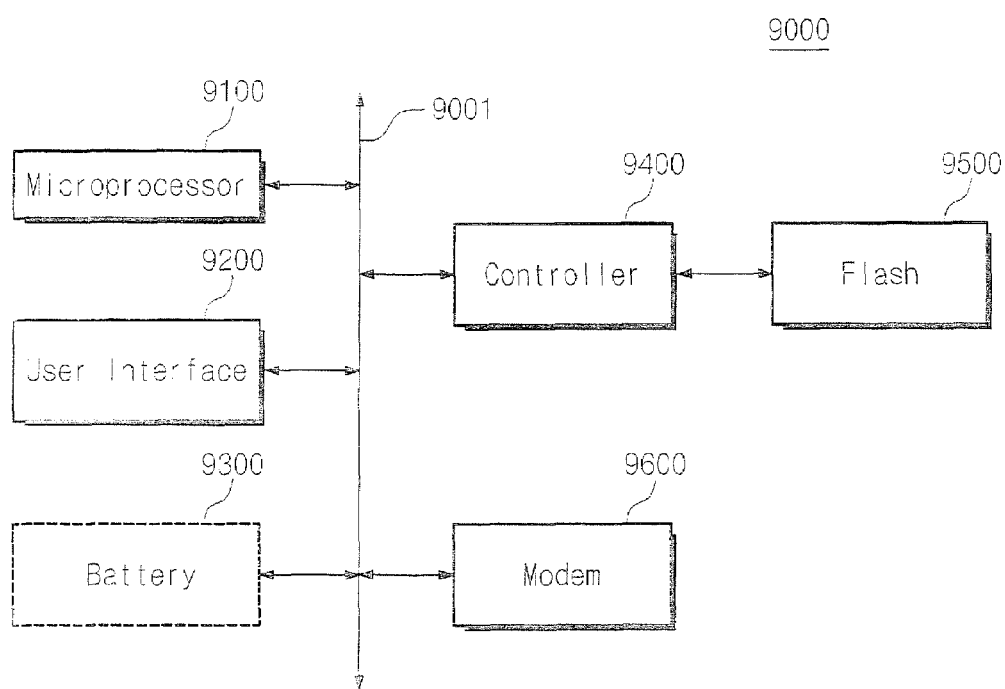
FIG. 9 is a block diagram of electronic devices including nonvolatile flash memory according to embodiments of the present invention.

FIG. 9 is a block diagram of a portable and/or wireless electronic device 9000 including nonvolatile flash memory according to embodiments of the present invention. The electronic device 9000, for example, may include a microprocessor 9100, a user interface 9200, a battery, and/or a modem 9600 coupled over a bus 9001. In addition, a nonvolatile flash memory device 9500 may be coupled to the bus 9001 through a memory controller 9400. More particularly, the nonvolatile flash memory device 9500 may be implemented according to embodiments of the present invention as discussed above with respect to FIGS. 5A, 7, and/or 8. The electronic device 9000 may be a hand held or laptop computer, a personal digital assistant, a digital audio/video player/recorder, a radiotelephone (with inclusion of a transceiver), a positioning/mapping device (with inclusion of a positioning receiver, such as a GPS receiver), etc.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. A method of operating a memory device including a memory cell array having a plurality of memory cell transistors serially coupled in a string between a string selection transistor and a ground selection transistor, wherein the string selection transistor is coupled between the string and a bit line, wherein the ground selection transistor is coupled between the string and a common source line, and wherein each memory cell transistor includes a floating gate between a control gate electrode and a semiconductor substrate and source/drain regions of the semiconductor substrate on opposite sides of the control gate electrode, the method comprising:
   responsive to an erase command, erasing the memory cell transistors of the string; and
   responsive to the erase command and after erasing the memory cell transistors of the string, discharging electrical charge from the source/drain regions of the memory cell transistors through the ground selection transistor to the common source line and/or through the string selection transistor to the bit line.

2. A method according to claim 1 wherein discharging electrical charge is performed before any other operation for the memory cell transistors of the string after erasing the memory cell transistors of the string.

3. A method according to claim 1 wherein discharging electrical charge is performed before any program and/or read operation for the memory cell transistors of the string after erasing the memory cell transistors of the string.

4. A method according to claim 1 further comprising:
   after discharging electrical charge from the source/drain regions of the memory cell transistors, performing an erase verify operation for the memory cell transistors of the string.

5. A method according to claim 1 wherein discharging electrical charge from the source/drain regions comprises discharging positive electrical charges from the source/drain regions.

6. A method according to claim 1 wherein discharging electrical charge from the source/drain regions comprises applying an enable signal to the control gates of all of the memory cell transistors of the string.

7. A method according to claim 6 wherein discharging electrical charge from the source/drain regions comprises applying a discharge signal to the ground selection transistor and/or to the string selection transistor wherein the discharge signal has a magnitude less than a magnitude of the enable signal during at least a portion of the discharging operation.

8. A method according to claim 6 wherein discharging electrical charge from the source/drain regions comprises applying a discharge signal to the ground selection transistor and/or to the string selection transistor wherein the discharge signal has a magnitude that increases during at least a portion of the discharging operation.

9. A method according to claim 1 wherein discharging electrical charge from the source/drain regions of the memory cell transistors comprises discharging electrical charge from the source/drain regions through the ground selection transistor to the common source line and through a common source line transistor to a reference ground.

10. A method according to claim 9 wherein discharging electrical charge from the source/drain regions comprises applying an enable signal to the control gates of all of the memory cell transistors.

11. A method according to claim 10 wherein discharging electrical charge from the source/drain regions comprises applying a discharge signal to a control gate of the common source line transistor wherein the discharge signal has a magnitude less than a magnitude of the enable signal during at least a portion of the discharging operation.

12. A method according to claim 10 wherein discharging electrical charge from the source/drain regions comprises applying a discharge signal to a control gate of the common source line transistor wherein the discharge signal has a magnitude that increases during at least a portion of the discharging operation.

13. A method according to claim 1 wherein the memory cell array includes a second plurality of memory cell transistors serially coupled in a second string between a second string selection transistor and a second ground selection transistor, wherein the second string selection transistor is coupled between the second string and a second bit line, wherein the second ground selection transistor is coupled between the string and the common source line, wherein the memory cell transistors of the first and second strings are in a same well region, and wherein erasing the memory cell transistors of the string comprises erasing the memory cell transistors of the first and second strings responsive to receiving the erase command.

14. A method according to claim 13 wherein discharging electrical charge comprises discharging electrical charge from the source/drain regions of the memory cell transistors of the first string through the first ground selection transistor to the common source line and/or through the first string selection transistor to the first bit line, and discharging electrical charge from the source/drain regions of the memory cell transistors of the second string through the second ground selection transistor to the common source line and/or through the second string selection transistor to the second bit line.

15. A method according to claim 1 wherein the memory cell array includes a second plurality of memory cell transistors serially coupled in a second string between a second string selection transistor and a second ground selection transistor, wherein the second string selection transistor is coupled between the second string and the bit line, wherein the second ground selection transistor is coupled between the string and a second common source line, wherein the memory cell transistors of the first and second strings are in a same well region, and wherein erasing the memory cell transistors of the string comprises erasing the memory cell transistors of the first and second strings responsive to receiving the erase command.

16. A method according to claim 15 wherein discharging electrical charge comprises discharging electrical charge from the source/drain regions of the memory cell transistors of the first string through the first ground selection transistor to the first common source line and/or through the first string selection transistor to the bit line, and discharging electrical charge from the source/drain regions of the memory cell transistors of the second string through the second ground selection transistor to the second common source line and/or through the second string selection transistor to the bit line.

17. An electronic device comprising:
   a memory cell array including a plurality of memory cell transistors serially coupled in a string between a string selection transistor and a ground selection transistor, wherein the string selection transistor is coupled between the string and a bit line, wherein the ground selection transistor is coupled between the string and a common source line, and wherein each memory cell transistor includes a floating gate between a control gate electrode and a semiconductor substrate and source/drain regions of the semiconductor substrate on opposite sides of the control gate electrode; and a controller electrically coupled to the memory cell array, the controller being configured to erase the memory cell transistors of the string responsive to an erase command, and to discharge electrical charge from the source/drain regions of the memory cell transistors through the ground selection transistor to the common source line and/or through the string selection transistor to the bit line responsive to the erase command after erasing the memory cell transistors of the string.

18. An electronic device according to claim 17 wherein the controller is configured to discharge electrical charge before any other operation for the memory cell transistors of the string after erasing the memory cell transistors of the string.

19. An electronic device according to claim 17 wherein the controller is configured to discharge electrical charge before any program and/or read operation for the memory cell transistors of the string after erasing the memory cell transistors of the string.

20. An electronic device according to claim 17 wherein the controller is configured to perform an erase verify operation for the memory cell transistors of the string after discharging electrical charge from the source/drain regions of the memory cell transistors.

21. An electronic device according to claim 17 wherein discharging electrical charge from the source/drain regions comprises discharging positive electrical charges from the source/drain regions.

22. An electronic device according to claim 17 wherein the controller is configured to discharge electrical charge from the source/drain regions by applying an enable signal to the control gates of all of the memory cell transistors of the string.

23. An electronic device comprising:
a memory cell array including a plurality of memory cell transistors serially coupled in a string between a string selection transistor and a ground selection transistor, wherein the string selection transistor is coupled between the string and a bit line, wherein the ground selection transistor is coupled between the string and a common source line, and wherein each memory cell transistor includes a floating gate between a control gate electrode and a semiconductor substrate and source/drain regions of the semiconductor substrate on opposite sides of the control gate electrode; and
a controller electrically coupled to the memory cell array, the controller being configured to erase the memory cell transistors of the string responsive to an erase command, and to discharge electrical charge from the source/drain regions of the memory cell transistors through the ground selection transistor to the common source line responsive to the erase command after erasing the memory cell transistors of the string, wherein the controller includes,
a word line driver configured to apply an enable signal to the control gates of all of the memory cell transistors of the string while discharging electrical charge from the source/drain regions of the memory cell transistors, and
a common source line driver configured to apply a discharge signal to a control gate of the ground selection transistor while discharging electrical charge from the source/drain regions of the memory cell transistors with the discharge signal being different than the enable signal.

24. An electronic device comprising:
a memory cell array including a plurality of memory cell transistors serially coupled in a string between a string selection transistor and a ground selection transistor, wherein the string selection transistor is coupled between the string and a bit line, wherein the ground selection transistor is coupled between the string and a common source line, and wherein each memory cell transistor includes a floating gate between a control gate electrode and a semiconductor substrate and source/drain regions of the semiconductor substrate on opposite sides of the control gate electrode; and
a controller electrically coupled to the memory cell array, the controller being configured to erase the memory cell transistors of the string responsive to an erase command, and to discharge electrical charge from the source/drain regions of the memory cell transistors through the string selection transistor to the bit line responsive to the erase command after erasing the memory cell transistors of the string, wherein the controller includes,
a word line driver configured to apply an enable signal to the control gates of all of the memory cell transistors of the string while discharging electrical charge from the source/drain regions of the memory cell transistors, and
a string selection line driver configured to apply a discharge signal to a control gate of the string selection transistor while discharging electrical charge from the source/drain regions of the memory cell transistors with the discharge signal being different than the enable signal.

25. An electronic device comprising:
a memory cell array including a plurality of memory cell transistors serially coupled in a string between a string selection transistor and a ground selection transistor, wherein the string selection transistor is coupled between the string and a bit line, wherein the ground selection transistor is coupled between the string and a common source line, and wherein each memory cell transistor includes a floating gate between a control gate electrode and a semiconductor substrate and source/drain regions of the semiconductor substrate on opposite sides of the control gate electrode; and
a controller electrically coupled to the memory cell array, the controller being configured to erase the memory cell transistors of the string responsive to an erase command, and to discharge electrical charge from the source/drain regions of the memory cell transistors through the ground selection transistor to the common source line responsive to the erase command after erasing the memory cell transistors of the string, wherein the controller includes,
a word line driver configured to apply an enable signal to the control gates of all of the memory cell transistors of the string while discharging electrical charge from the source/drain regions of the memory cell transistors, and
a ground selection line driver configured to apply a discharge signal to a control gate of the ground selection transistor while discharging electrical charge from the source/drain regions of the memory cell transistors with the discharge signal being different than the enable signal.

* * * * *